(12) United States Patent
Li

(10) Patent No.: US 6,915,223 B2
(45) Date of Patent: Jul. 5, 2005

(54) WAVEFORM DISPLAY EQUIPMENT AND WAVEFORM DISPLAYING METHOD

(75) Inventor: Yinxiu Li, Musashino (JP)

(73) Assignee: Yokogawa Electric Corporation, Tokyo (JP)

( * ) Notice: Subject to any disclaimer, the term of this patent is extended or adjusted under 35 U.S.C. 154(b) by 1 day.

(21) Appl. No.: 10/684,446

(22) Filed: Oct. 15, 2003

(65) Prior Publication Data

US 2004/0172209 A1 Sep. 2, 2004

(30) Foreign Application Priority Data

Feb. 27, 2003 (JP) ........................................ 2003-050178

(51) Int. Cl.⁷ .......................... G06T 11/20; G01R 13/00; G01R 13/02
(52) U.S. Cl. .......................... 702/67; 702/68; 345/440.1
(58) Field of Search ...................... 702/66–68; 345/440, 345/440.1, 441

(56) References Cited

U.S. PATENT DOCUMENTS

| | | | | |
|---|---|---|---|---|
| 4,743,844 A | * | 5/1988 | Odenheimer et al. ... | 324/121 R |
| 5,075,618 A | * | 12/1991 | Katayama ................. | 324/76.27 |
| 5,579,463 A | * | 11/1996 | Takano et al. ............... | 345/440 |
| 5,684,507 A | * | 11/1997 | Rasnake et al. .......... | 345/440.1 |
| 5,684,508 A | * | 11/1997 | Brilman .................... | 345/440.1 |
| 6,229,536 B1 | * | 5/2001 | Alexander et al. ........ | 345/440.1 |
| 6,687,628 B2 | * | 2/2004 | Jaffe ........................... | 702/67 |

FOREIGN PATENT DOCUMENTS

JP 8-29455 2/1996

* cited by examiner

Primary Examiner—Marc S. Hoff
Assistant Examiner—Paul Kim
(74) Attorney, Agent, or Firm—Westerman, Hattori, Daniels & Adrian, LLP

(57) ABSTRACT

The object of the present invention is to realize waveform display equipment and to achieve a waveform displaying method, in which a plurality of waveforms can be easily observed and measured. The present invention improves conventional waveform display equipment in which a plurality of waveforms based on waveform data obtained by measuring signals to be measured are displayed in the display region of a display screen. The equipment is characterized by the fact that, a discriminating means which discriminates measuring periods for each of displayed waveform data, and a split display means which splits the display region into a number of mutually-different measuring periods based on the result of discrimination and displays a waveform measured in one of the mutually-different measuring periods or a plurality of waveforms, each measured in the same measuring period composing one of the mutually-different measuring periods, in each of split display regions, are provided.

7 Claims, 9 Drawing Sheets

FIG.1 (Prior Art)
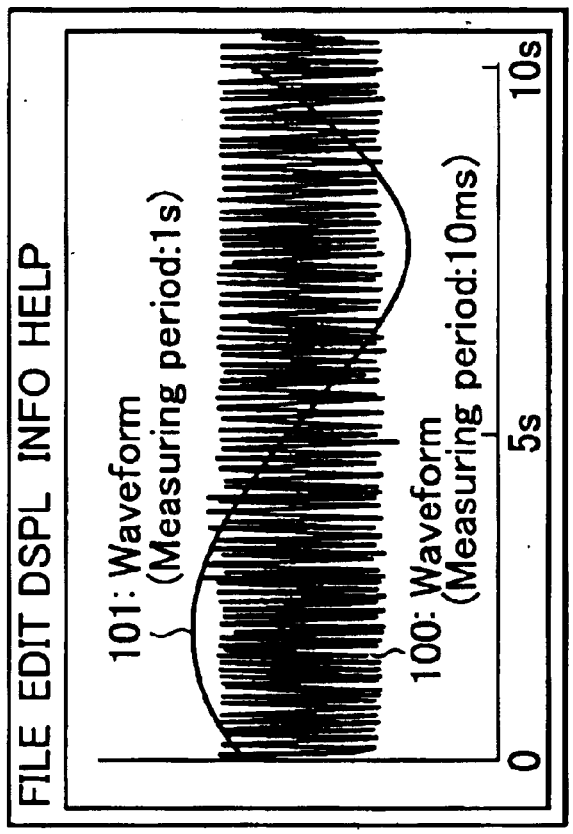
(a) Example of display suitable for fast measuring periods
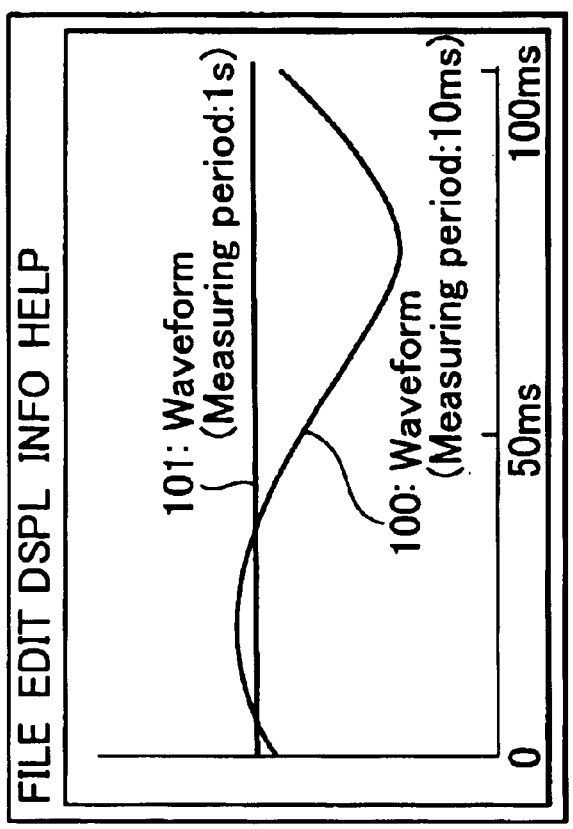
(b) Example of display suitable for slow measuring periods

WAVEFORM DISPLAY EQUIPMENT AND WAVEFORM DISPLAYING METHOD

BACKGROUND OF THE INVENTION

1. Field of the Invention

The present invention relates to waveform display equipment which displays a plurality of waveforms based on the waveform data obtained by measuring signals to be measured in the display region of a display screen and a waveform displaying method to display such waveforms. Specifically, the invention relates to waveform display equipment and a waveform displaying method, in which a plurality of waveforms is easily observed and measured.

2. Description of the Prior Art

A waveform measuring system measures various physical quantities such as temperature, pressure, strain resistance, etc. by converting those quantities to electrical signals using converting means suitable for each application, and stores them as waveform data. In such a system, variations of these electrical signals, that is, variations of the physical quantities, can be observed and measured by displaying waveforms in the display region of a display screen based on the stored waveform data. Electrical signals such as input/output signals to/from electrical circuits can, of course, also be displayed. Such a system includes paperless recorders, digital oscilloscopes, etc.

Waveform display equipment used for the waveform measuring system can simultaneously display a plurality of waveforms, for example, taking voltage values as the ordinate and time as the abscissa (for instance, refer to the gazette of Japanese Laid-open Patent Application No. 8-29455).

However, if various physical quantities are to be measured, it is necessary to carry out measurement using optimum measuring periods respectively. For example, a signal whose changes are slow such as temperature signals needs to be measured using a slow measuring period (e.g., 1-s interval), and a signal whose changes are fast such as input/output signals to/from electric circuits must be measured using a fast measuring period (e.g., 10-ms interval).

FIG. 1 shows an example of displaying waveform data obtained by measurement using different measuring periods. In FIG. 1, waveform 100 shows a waveform obtained by measurement using a fast measuring period (for example, 10 ms) and waveform 101 shows a waveform obtained by measurement using a slow measuring period (for example, 1 s). FIG. 1(a) is an example of a display suitable for a fast measuring period and FIG. 1(b) is an example of a display suitable for a slow measuring period.

FIG. 1(a) displays waveform 100 by setting the abscissa so that waveform 100 can be conveniently observed. However, waveform 101 is shown rather flat due to this setting and thus its observation and measurement become difficult. On the other hand, FIG. 1(b) displays waveform 101 by setting the abscissa so that waveform 101 can be conveniently observed. However, due to this setting, waveform 100 is displayed rather overlapping the time base and so its observation and measurement become difficult. That is, these waveform measuring systems in the prior art have a problem that, if signals whose varying conditions are different with time respectively are to be observed and measured, it is hard to obtain a display that is optimum for all signal waveforms 100, 101, etc.

SUMMARY OF THE INVENTION

The object of the present invention is to realize waveform display equipment and to achieve a waveform displaying method, in which a plurality of waveforms can be easily observed and measured.

BRIEF DESCRIPTION OF THE DRAWINGS

FIG. 1 is a drawing indicating examples of display in conventional equipment.

DETAILED DESCRIPTION OF THE PREFERRED EMBODIMENTS

Embodiments of the present invention are described below using the drawings.

[First Embodiment]

Figure 2:
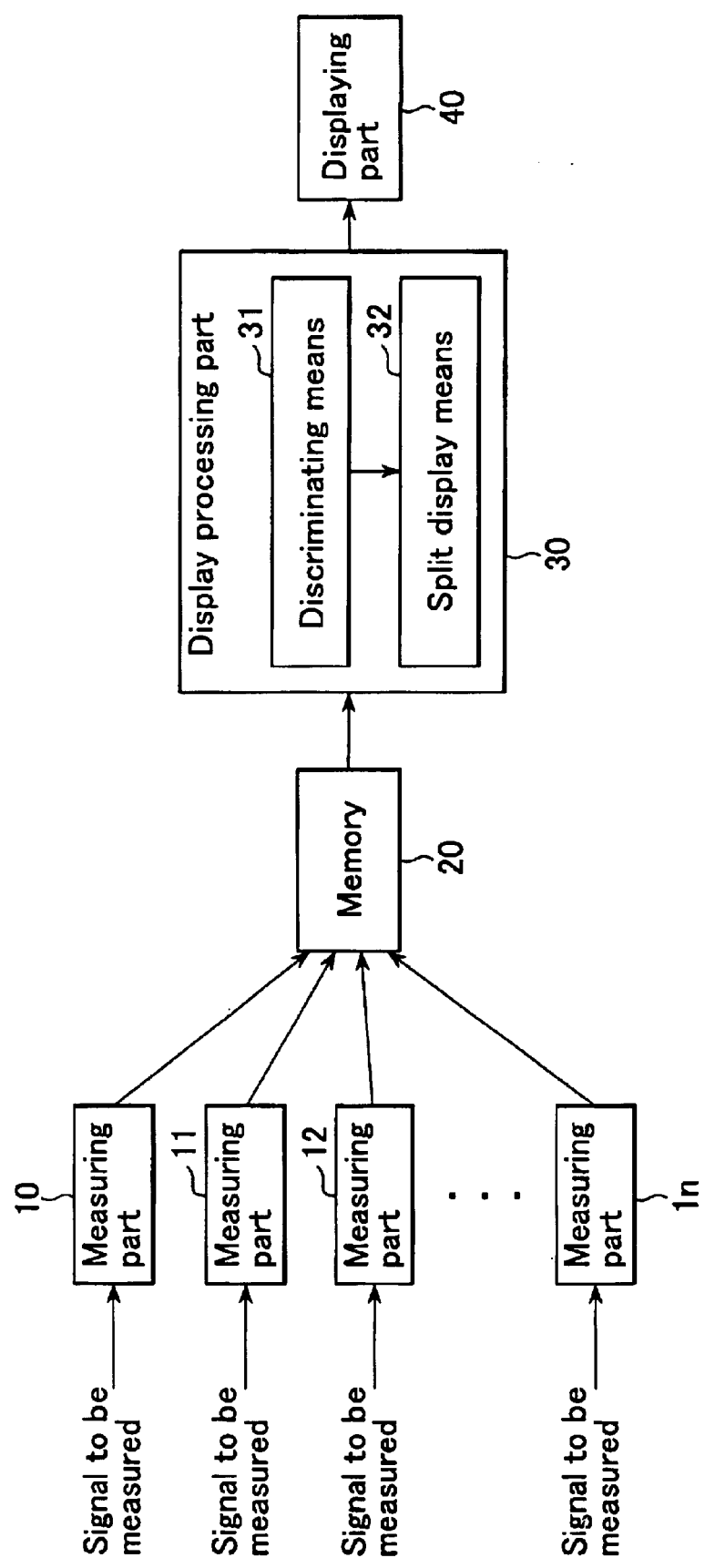
FIG. 2 is a configuration drawing showing a first embodiment of the present invention.

FIG. 2 is a configuration drawing showing a first embodiment of the present invention. In FIG. 2, measuring parts 10, 11, 12, ... 1n (where n is a natural number) receive each signal to be measured as inputs and output these signals to be measured after converting them to waveform data that are digital signals. Memory 20 receives the waveform data from measuring parts 10 to 1n as inputs and stores them. Display processing part 30 includes discriminating means 31 and split display means 32 and reads the waveform data stored in memory 20, performs desired processing on these waveform data and displays them in display regions on the display screen (not shown) of displaying part 40.

Further, discriminating means 31 discriminates each measuring period for the waveform data read by display processing part 30, that is, the waveform data to be displayed in displaying part 40. Split display means 32 splits the display region on the display screen of displaying part 40 into a number of mutually-different measuring periods based on the results of discrimination in discriminating means 31 and displays a waveform or waveforms in each of split display regions for each measuring period respectively.

In a paperless recorder, measuring parts 10 to 1n are installed in each place of measurement respectively and are separated from memory 20, display processing part 30 and displaying part 40. Memory 20, display processing part 30 and displaying part 40 are, for example, represented by a computer. On the other hand, in the case of digital oscilloscopes, measuring parts 10 to 1n, memory 20, display processing part 30, and displaying part 40 are integrated into one body.

In addition, for a paperless recorder, windows are opened in a part or the whole of the display screen of displaying part 40 and each of the windows becomes a display region. While in digital oscilloscopes, in many cases, the entire display screen of displaying part 40 composes the display regions.

The operations of such equipment will now be described.

Measuring parts 10 to 1n convert signals to be measured to electrical signals using converting means not shown in the drawing, convert these electrical signals into digital signals in preset measuring periods, and carry out measurement for a definite time. If a signal to be measured input to a measuring part is an electrical signal, the converting means is not necessary. Measuring parts 10 to 1n store data converted to digital signals, measuring periods and the instants when data acquisition is started in memory 20 as waveform data.

A measuring period for measuring a signal to be measured is set so that the variation of the signal to be measured with time can be observed and measured most suitably. For example, if quantities of variation with time are predicted in advance, measuring periods are set to measuring parts 10 to 1n by a user. If prediction is difficult or variation is not definite, measuring parts 10 to 1n set the measuring periods so that most suitable measuring periods are automatically obtained.

Display processing part 30 reads the waveform data to be displayed out of the waveform data stored in memory 20. Further, discriminating means 31 discriminates each measuring period of read waveform data and determines the number of mutually-different measuring periods. Split display means 32 splits the display region of display 40 into a number of mutually-different measuring periods based on the results of discrimination, and displays a waveform or waveforms in the split display regions respectively. In this case, waveforms measured in different measuring periods are displayed in different display regions.

For example, if waveform data measured by measuring part 10 in measuring period Δt1, by measuring part 11 in measuring period Δt2, by measuring part 12 in measuring period Δt3, and by measuring part 1n in measuring period Δt4, are to be displayed, discriminating means 31 determines the number of mutually-different measuring periods as 4. Next, split display means 32 splits the display region of a display screen into 4 and displays the waveform data for measuring periods Δt1 to Δt4 in each split display region separately. In this case, split display means 32 splits the display region based on the shape of the display region and the results of discrimination into split display regions of the same size.

Figure 3:
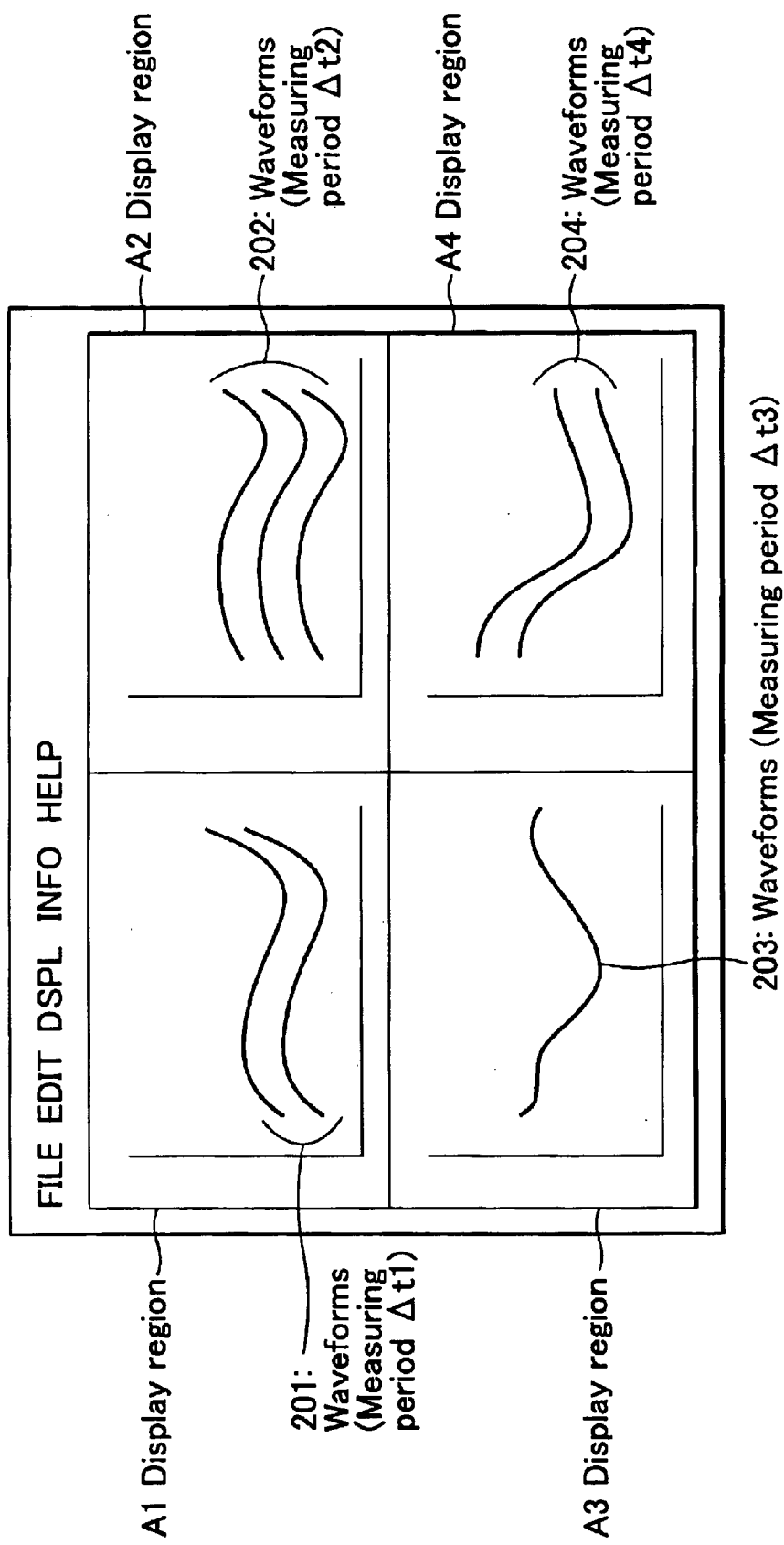
FIG. 3 is a drawing indicating a first example of display in the equipment shown in FIG. 2.

An example of display is shown in FIG. 3. In this example, an approximately square display region is split into four display regions A1 to A4 located at the upper left, upper right, lower left and lower right in this order. In FIG. 3, waveforms 201 are displayed based on the waveform data obtained by measurement in measuring period Δt1, waveforms 202 based on the waveform data obtained by measurement in measuring period Δt2, waveform 203 is displayed based on the waveform data obtained by measurement in measuring period Δt3, and waveforms 204 are displayed based on the waveform data obtained by measurement in measuring period Δt4, respectively. Further, waveforms 201 are displayed in split display region A1, waveforms 202 in split display region A2, waveform 203 in split display region A3, and waveforms 204 in split display region A4. That is, these waveforms are displayed in different display regions A1 to A4 for each measuring period Δt1 to Δt4.

Figure 4:
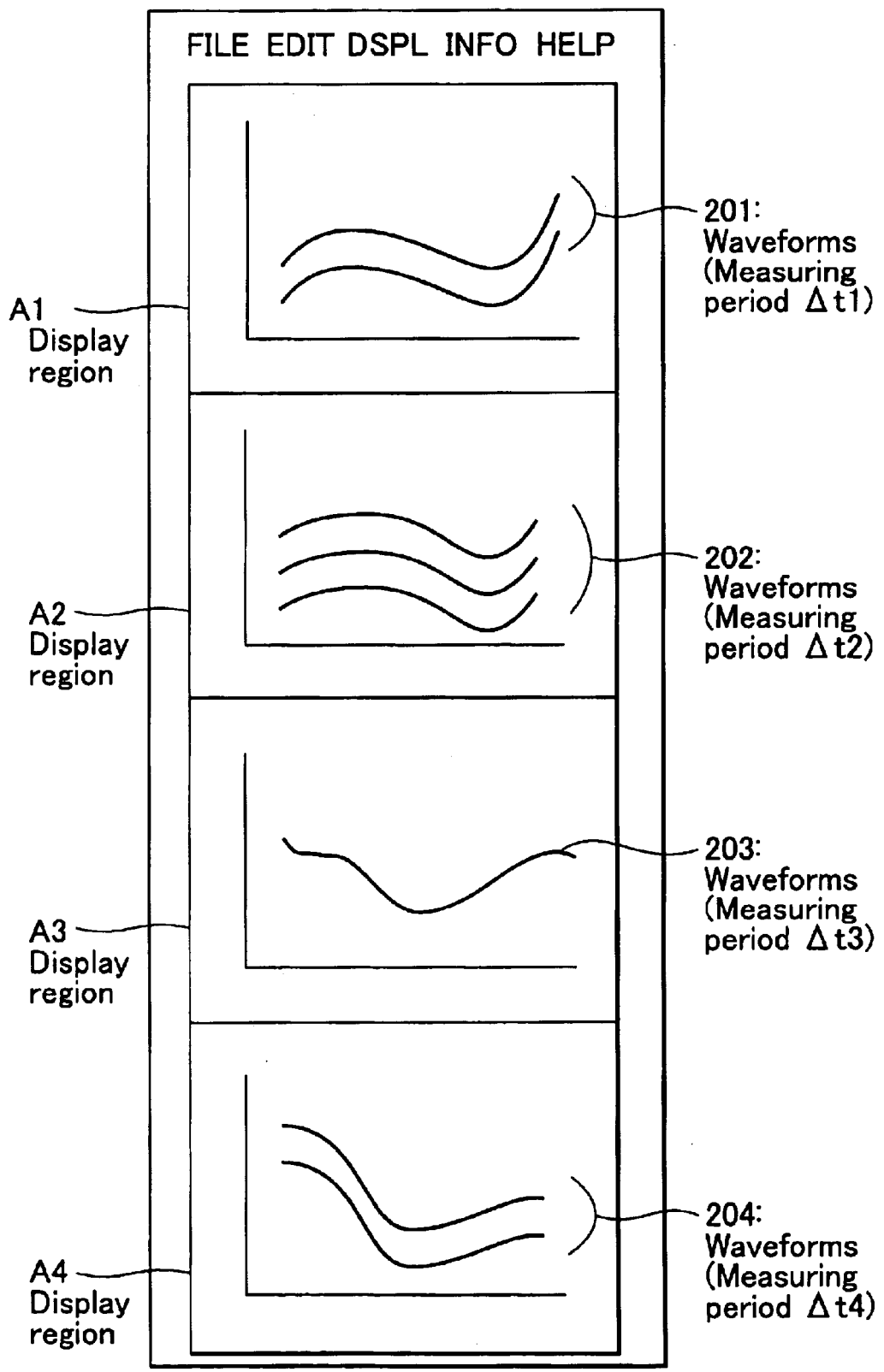
FIG. 4 is a drawing indicating a second example of display in the equipment shown in FIG. 2.
Figure 5:
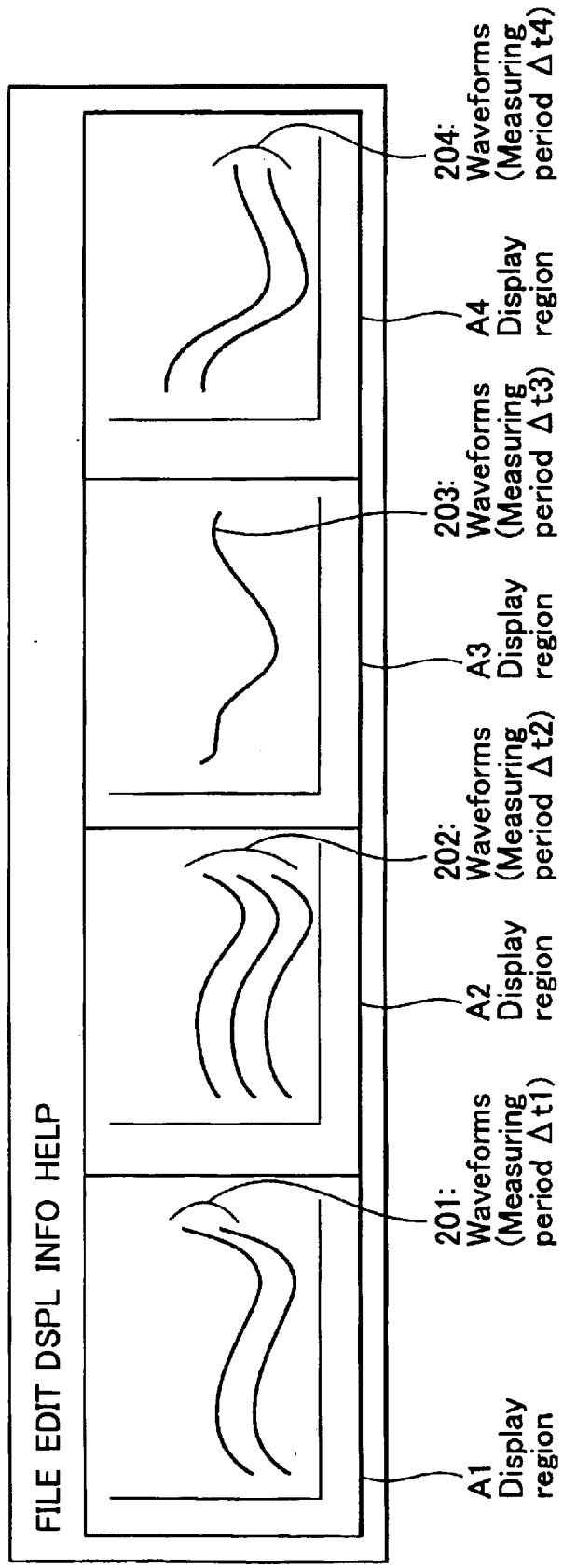
FIG. 5 is a drawing indicating a third example of display in the equipment shown in FIG. 2.

FIG. 4 and FIG. 5 are drawings in which different examples of display are shown. In FIG. 4 and FIG. 5, the same items as those in FIG. 3 are given the same signs and their description is omitted. In FIG. 4, the display region is split into 4 in the vertical direction. That is, in FIG. 4, waveforms 201 for measuring period Δt1, waveforms 202 for measuring period Δt2, waveform 203 for measuring period Δt3, and waveforms 204 for measuring period Δt4 are displayed in display regions A1, A2, A3 and A4 respectively in the direction from top to bottom. On the other hand, in FIG. 5, the display region is split into 4 in the horizontal direction. That is, in FIG. 5, waveforms 201 for measuring period Δt1, waveforms 202 for measuring period Δt2, waveform 203 for measuring period Δt3, and waveforms 204 for measuring period Δt4 are displayed in display regions A1, A2, A3 and A4 respectively in the direction from left to right.

Figure 6:
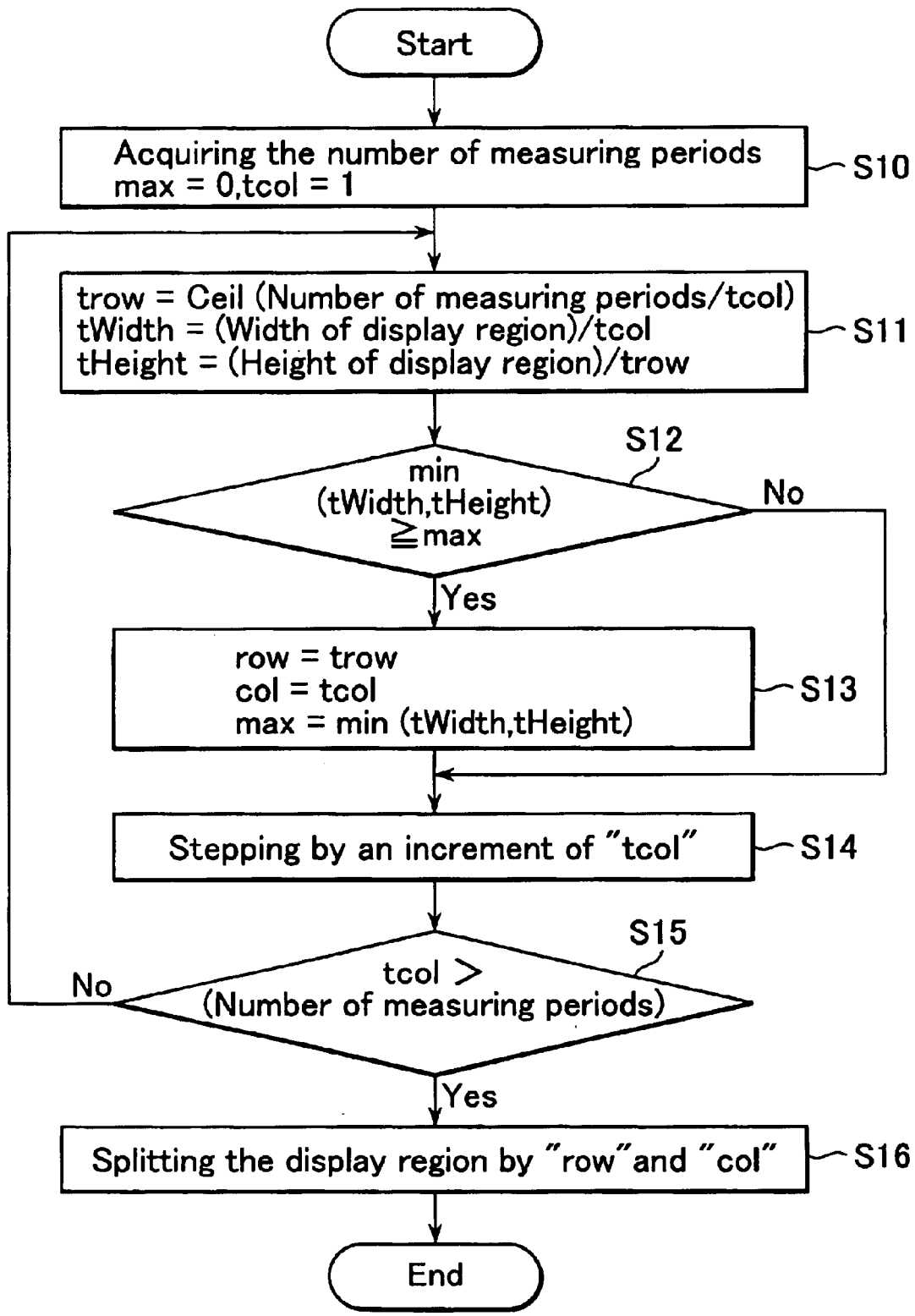
FIG. 6 is a flow chart indicating the operations of split display means 32.

Subsequently, operations in which split display means 32 splits a display region into display regions A1 to A4 depending on the shape of the display region will be described in detail using the flow chart shown in FIG. 6.

A variable for column "tcol" and a variable for comparison "max" are initialized to "tcol"=1 and "max"=0 respectively at the same time as the number of mutually-different measuring periods is input from discriminating means 31 (S10).

Then, calculation of the following equations (1) to (3) is implemented in turn (S11):

$$\text{"trow"}=\text{Ceil (Number of mutually-different measuring periods/ "tcol")} \quad (1)$$

$$\text{"tWidth"}=(\text{Width of display region})/\text{"tcol"} \quad (2)$$

$$\text{"tHeight"}=(\text{Height of display region})/\text{"trow"} \quad (3)$$

where, for Ceil(x), the smallest integer should be selected out of integers of x or more, "trow" is a variable for row, and "tWidth" and "tHeight" are respectively a variable for region width after splitting and a variable for region height after splitting.

Next, comparison is carried out using the following equation (4) (S12).

$$\min(t\text{Width}, t\text{Height}) \geq \text{"max"} \quad (4)$$

For min(x, y) in equation (4), select the smaller value of x or y. If the comparison in equation (4) is "Yes", perform equations (5) to (7) in turn (S13):

$$\text{"row"}=\text{"trow"} \quad (5)$$

$$\text{"col"}=\text{"tcol"} \quad (6)$$

$$\text{"max"}=\min(t\text{Width}, t\text{Height}) \quad (7)$$

where "col" and "row" are respectively a variable for split column and a variable for split row.

Subsequent to step (S13) or if the comparison in equation (4) in step (S12) is "No", increment the variable for column "tcol" by one (Sl4). If the value of the variable for column "tcol" is equal to or less than the number of mutually-different measuring periods, determine again the values of the variable for split row "row" and the variable for split column "col" (S15, and S11 to S14). If the value of the variable for column "tcol" is larger than the number of mutually-different measuring periods, split the height of the display region with the value of the variable for split row "row" and split the width of the display region with the value of the variable for split column "col" to split the display region into display regions A1 to A4 (S15 and S16).

For example, if each of waveforms 201 to 204 for four mutually-different measuring periods Δt1 to Δt4 is to be displayed respectively in a display region of 600 dots (width)×400 dots (height), the variable for split row "row"=2 and the variable for split column "col"=3 are obtained and the sizes of the four display regions A1 to A4 become 200 dots (width)×200 dots (height). As a result, the display region is split into 2 vertically and split into 3 horizontally. Display regions A1 to A3 are allocated to the upper row and display region A4 is allocated to any one of three regions split into 3 horizontally in the lower row.

As described above, split display means 32 splits a display region into a number of mutually-different measuring periods $\Delta t1$ to $\Delta t4$ for waveform data determined by discriminating means 31. Since waveforms 201 for measuring period $\Delta t1$ are displayed in split display region A1, waveforms 202 for measuring period $\Delta t2$ in split display region A2, waveform 203 for measuring period $\Delta t3$ in split display region A3, and waveforms 204 for measuring period $\Delta t4$ in split display region A4, waveforms 201 to 204 for a plurality of measuring periods $\Delta t1$ to $\Delta t4$ can be displayed on each time base optimum to each of waveforms 201 to 204 respectively. This enables a plurality of waveforms 201 to 204 to be easily observed and measured.

In addition, since split display means 32 splits a display region into display regions A1 to A4 of the same size depending on the shape of the display region and the number of mutually-different measuring periods $\Delta t1$ to $\Delta t4$, waveforms 201 to 204 are not displayed in an overlapping manner and so waveforms 201 to 204 can be easily compared. This facilitates observation and measurement of a plurality of waveforms 201 to 204.

[Second Embodiment]

Figure 7:
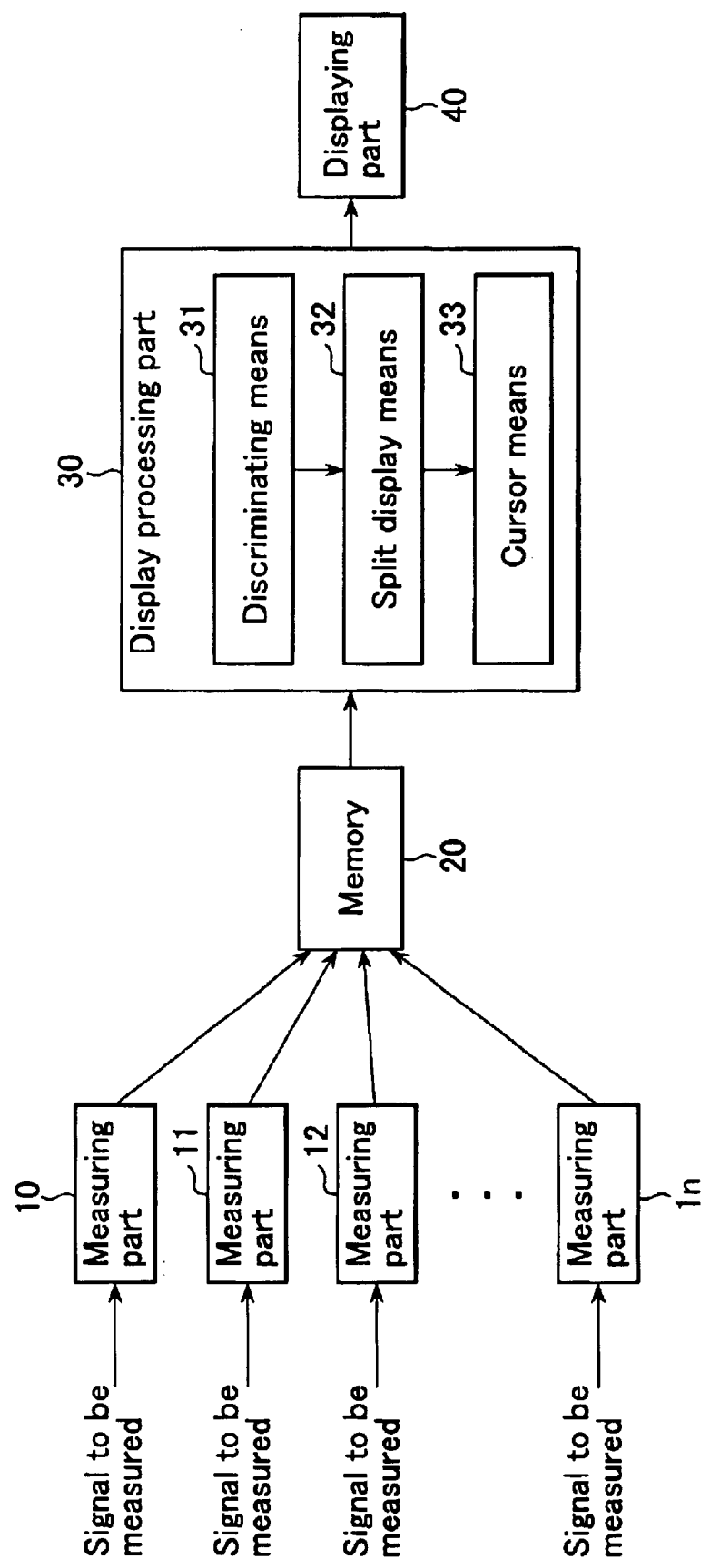
FIG. 7 is a configuration drawing showing a second embodiment of the present invention.

FIG. 7 is a configuration drawing showing a second embodiment of the present invention. In FIG. 7, the same items as those in FIG. 2 are given the same signs and their description is omitted. In FIG. 7, cursor means 33 is newly provided in display processing part 30. Cursor means 33 displays a cursor in each of split display regions split by split display means 32 and displays these cursors in the positions in each of the display regions corresponding to the same instant or positions in each of the display regions corresponding to the vicinities of that instant.

Figure 8:
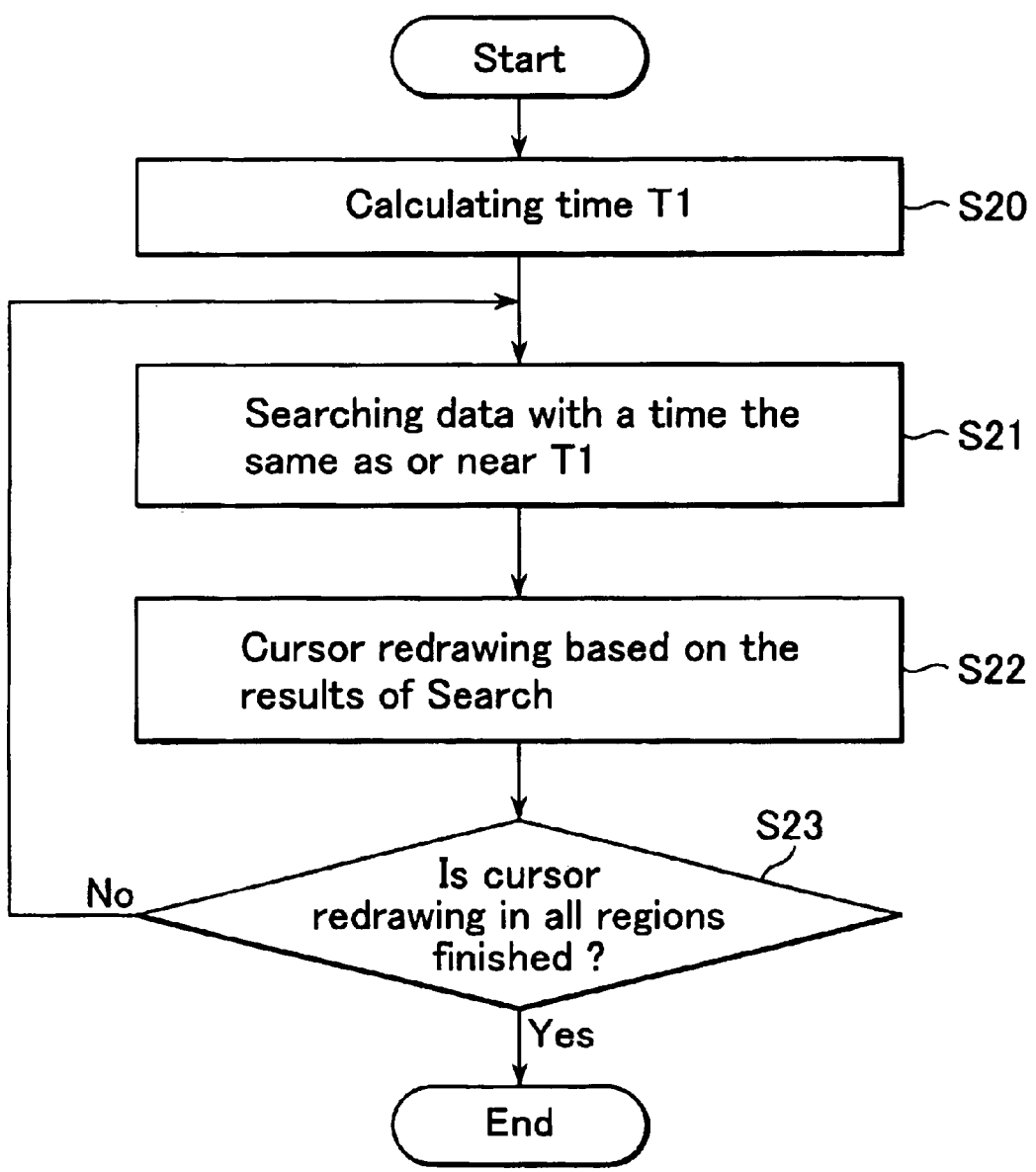
FIG. 8 is a flow chart indicating the operations of cursor means 33.

Operations of cursor means 33 will now be described using the flow chart shown in FIG. 8. When a display position of the cursor is set in one of a plurality of display regions by an operation from a controller (for example, an input/pointing device such like mouse/keyboard) not shown in the drawing, cursor means 33 determines the instant T1 in a display position where the cursor is set from waveform data (S20). Then, in each of the other display regions, data acquired at the same time as T1 determined using measuring periods for waveform data and data acquisition starting time, are searched. However, if there are no data acquired at the same time as the instant T1, data at the time nearest to the instant T1 or data acquired just before or after the instant T1 are searched (S21). Cursors are displayed by re-drawing them in the positions in each of the display regions corresponding to the searched data or in the positions in each of the display regions corresponding to the instant T1 by performing linear approximation or curvilinear approximation from the data acquired just before and after the instant T1 (S22). If cursor-displaying is completed in all the display regions, processing is finished (S23), and if there is any display region where cursor displaying is not finished, cursor means 33 displays the cursor in that region (S23, S21, and S22).

Figure 9:
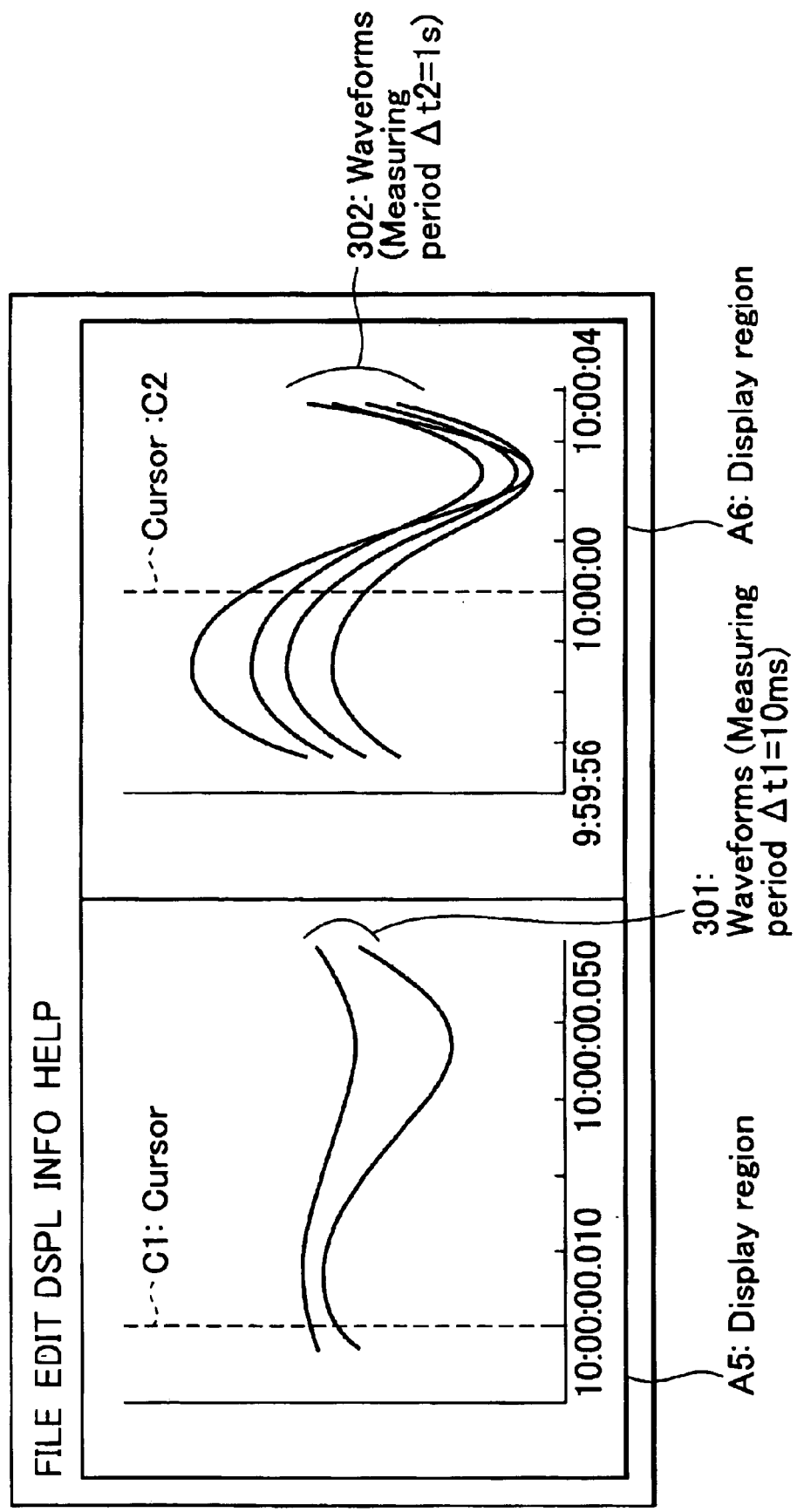
FIG. 9 is a drawing indicating examples of display in the equipment shown in FIG. 7.

FIG. 9 is a drawing showing examples of display in which cursors C1 and C2 are displayed by cursor means 33. In FIG. 9, the display region is split into display regions A5 and A6. Waveforms 301 are displayed based on waveform data obtained by measurement in measuring period $\Delta t1$ and waveforms 302, based on waveform data obtained by measurement in measuring period $\Delta t2$, respectively. Also, waveforms 301 are displayed in display region A5 and waveforms 302 are displayed in display region A6. The abscissa represents the time. In these regions, measuring period $\Delta t1$ is set to 10 ms and measuring period $\Delta t2$ is set to 1 s. In display region A5, cursor C1 is set to the position corresponding to data acquired at the instant T1 of 10 o'clock 00 minute 00.010 second, while in display region A6, cursor C2 is displayed in the position corresponding to data acquired at the instant of 10 o'clock 00 minute 00 second nearest to the instant T1.

In addition, since operations other than those by which cursor means 33 displays cursors C1 and C2 making them associated with each other in split display regions A5 and A6 are similar to those in the equipment shown in FIG. 2, description of those operations is omitted.

As described above, since cursor means 33, when cursor C1 is moved in display region A5, which is one of the split display regions A5 and A6, displays cursor C2 associated with cursor C1 in the position corresponding to the same time or in a position corresponding to the vicinity of that instant also in the other display region A6, time correspondence even among different data for measuring periods $\Delta t1$ and $\Delta t2$ can be maintained. This facilitates observation and measurement for a plurality of waveforms.

The present invention is not restricted to the embodiments described above but may be embodied in such form as described below.

In the equipment shown in FIG. 2 and FIG. 7, a configuration is shown in which measuring parts 10 to 1n store data converted to digital signals, measuring periods, and instants when data acquisition is started as waveform data in memory 20, and discriminating means 31 discriminates the measuring periods for each waveform data using measuring periods. However, measuring parts 10 to 1n may also add the instants to every digital data item without storing measuring periods in memory 20 and then store these instants in memory 20. In this case, discriminating means 31 determines each measuring period using the instants when each data item is acquired.

Further, in FIG. 3, although an example is shown in which each of waveforms 201 to 204 for measuring periods $\Delta t1$ to $\Delta t4$ is displayed in turn in the upper-left display region A1, the upper-right display region A2, the lower-left display region A3 and the lower-right display region A4 respectively, they can be displayed in a desired sequence. Of course, also in FIG. 4 and FIG. 5, waveforms can be displayed in a desired sequence similarly. Also, although an example using four mutually-different measuring periods is given in FIG. 3, any number of mutually-different measuring periods can be used and a display region can be split depending on this number of mutually-different measuring periods.

In addition, in FIG. 3 through FIG. 5 and in FIG. 9, although a configuration is shown in which the sizes of display regions A1 to A4 or A5 and A6 split by split display means 32 are made equal, the sizes of display regions A1 to A4 or A5 and A6 after splitting may be different respectively.

In FIG. 9, although a configuration is shown in which the abscissa represents time, relative time referenced with, for example, one of the triggered points can also be used for display.

According to the present invention, there are the following effects:

The split display means splits a display region by the number of mutually-different measuring periods for waveform data determined by the discriminating means. Since the split display means does not display waveforms determined for different measuring periods in the same split display region but displays each of the waveforms in each split display region respectively, those waveforms can be displayed on each time base optimum for each of waveforms for a plurality of measuring periods. This facilitates observation and measurement of a plurality of waveforms.

Further, since the split display means splits a display region depending on the shape of the display region and the number of mutually-different measuring periods, waveforms can be easily compared without waveforms being displayed in an overlapping manner. This also facilitates observation and measurement of a plurality of waveforms.

Further, since, when a cursor is moved in one display region, which is one of the split display regions, the cursor means displays other cursors associated with the previously mentioned cursor in the positions in each of the display regions corresponding to the same time or positions in each of the display regions corresponding to the vicinities of that instant also in the other split display regions, time correspondence even among data for different measuring periods can be maintained. This enables a plurality of waveforms to be observed and measured easily.

Furthermore, since waveforms are displayed in split display regions by discriminating measuring periods for each displayed waveform data and by splitting a display region into the display regions depending on the number of mutually-different measuring periods, each waveform for a plurality of measuring periods can be displayed on each time base optimum for each of such waveforms. This also enables a plurality of waveforms to be observed and measured easily.

In addition, since cursors are displayed in each of split display regions and also displayed in the positions in each of the display regions corresponding to the same time or positions in each of the display regions corresponding to the vicinities of that time, time correspondence even among data for different measuring periods can be maintained. This facilitates observation and measurement of a plurality of waveforms.

What is claimed is:

1. Waveform display equipment which displays a plurality of waveforms based on waveform data obtained by measuring a plurality of signals to be measured in the display region of a display screen, comprising:
    a discriminating means which determines a number of mutually different measuring periods for said plurality of measured signals, and
    a split display means which splits said display region into said number of mutually-different measuring periods based on the result of determination by said discriminating means and displays a waveform measured in one of the mutually-different measuring periods or a plurality of waveforms, each measured in the same measuring period composing one of the mutually-different measuring periods, in each of split display regions.

2. Waveform display equipment in accordance with claim 1, wherein said split display means splits said display region based on the shape of said display region and the result of said discriminating means.

3. Waveform display equipment in accordance with claim 2, wherein said split display means makes the size of each of said split display regions equal.

4. Waveform display equipment in accordance with any of claims 1 to 3, wherein a cursor means is provided, which displays cursors in each of split display regions split by said split display means and also displays these cursors in the positions corresponding to the same time or positions corresponding to the vicinities of that time.

5. A waveform displaying method in which a plurality of waveforms based on the waveform data obtained by measuring a plurality of signals to be measured is displayed in the display region on a display screen, further discriminating a number of mutually different measuring periods based on the result into said number of mutually-different measuring periods based on the result of said discrimination, and displaying a waveform measured in one of the mutually-different measuring periods or a plurality of waveforms, each measured in the same measuring period composing one of the mutually-different measuring periods, in each of split display regions.

6. A waveform displaying method in accordance with claim 5, wherein each cursor is displayed in each of said split display regions and these cursors are also displayed in the positions corresponding to the same time or positions corresponding to the vicinities of that time.

7. Waveform display equipment which displays a plurality of waveforms based on waveform data obtained by measuring signals to be measured in the display region of a display screen, comprising:
    a discriminating means which discriminates each measuring period for said displayed waveform data, and
    a split display means which splits said display region into said number of mutually-different measuring periods based on the result of discrimination by said discriminating means and displays a waveform measured in one of the mutually-different measuring periods or a plurality of waveforms, each measured in the same measuring period composing one of the mutually-different measuring periods, in each of split display regions, wherein said split display means splits said display region based on the shape of said display region and the result of said discrimination.

* * * * *